United States Patent [19]

Sukegawa

[11] Patent Number: 5,257,228

[45] Date of Patent: Oct. 26, 1993

[54] EFFICIENCY IMPROVED DRAM ROW REDUNDANCY CIRCUIT

[75] Inventor: Shunichi Sukegawa, Ibaraki, Japan

[73] Assignee: Texas Instruments Incorporated, Dallas, Tex.

[21] Appl. No.: 701,233

[22] Filed: May 16, 1991

[51] Int. Cl.$^5$ .............................................. G11C 11/40
[52] U.S. Cl. ................................. 365/200; 365/189.07; 365/230.06; 371/10.1
[58] Field of Search .................. 365/189.07, 200, 201, 365/210, 230.06; 371/10.1, 10.2, 10.3; 307/463

[56] References Cited

U.S. PATENT DOCUMENTS

| | | | |
|---|---|---|---|
| 4,471,472 | 7/1984 | Young | 365/200 |
| 4,494,220 | 2/1985 | Dumbri et al. | 365/200 |
| 4,538,247 | 8/1985 | Venkateswaran | 365/200 |
| 4,737,935 | 4/1988 | Wawersig et al. | 365/200 |

Primary Examiner—Eugene R. LaRoche
Assistant Examiner—Vu A. Le
Attorney, Agent, or Firm—Stanton C. Braden; Richard L. Donaldson; William E. Hiller

[57] ABSTRACT

A redundancy scheme for a memory is disclosed which allows defect correction, particularly, word line to word line short correction through the use of a minimal number of redundant lines. The scheme makes use of some logical function of the non-matching address bits of two word lines between which a word line to word line short exists. The logical function can comprise the exclusive OR, or some function of the exclusive OR (i.e. exclusive NOR of the non-matching address bits of two word lines between which a word line to word line short exists.

7 Claims, 3 Drawing Sheets

EFFICIENCY IMPROVED DRAM ROW REDUNDANCY CIRCUIT

FIELD OF THE INVENTION

This invention is in the field of integrated circuits. More specifically this invention is in the field of memories.

BACKGROUND OF THE INVENTION

Electronic devices and systems such as printers, copiers, electronic storage devices (memories) high definition television, enhanced definition television and computational devices (e.g. calculators and computers including personal computers, minicomputers, personal computers and microcomputers) requiring electronic storage devices, often provide data storage on an integrated circuit chip. Because these devices often require large amounts of storage space for many applications, these storage devices are embodied in memory, for instance, a dynamic random access memory (DRAM). Memory cells sometimes contain or are associated with defects. It is therefore necessary to replace defective memory or defect associated memory with memory from alternate memory cells commonly referred to as redundant memory. Once defective memory is detected, the address corresponding to this memory is noted and the mechanism for implementing the redundant memory cells is enabled before the memory is used. The mechanism for implementing the redundant memory cells is usually embodied in a system based on blowing fuses. The scheme for producing a signal indicative of the desire to use the redundant memory, or rather, to match the row address of the defective memory, is of extreme importance. This redundancy scheme forms an integral part of the dynamic random access memory. This scheme is also an integral part of the above described devices and systems, supplying substantial value to these and other devices and systems in which it is used.

FIG. 1a illustrates a schematic drawing of a prior art redundancy scheme. N-channel transistor 2 is connected to P-channel transistor 4 through fuse 14. The gates of transistors 4 and 2 are connected to a terminal for powering up the circuit as shown. The drain of transistor 4 is connected to the input of inverter 10 and the drain of P-channel transistor 6. The drain of P-channel transistor 6 is also connected to the gate of N-channel transistor 8. The output of inverter 10 is connected to the gate of N-channel transistor 12. The signals from an address bit and its complement, $A_N$ and $A_{N-}$, respectively, are input into respective terminals of associated transistors 8 and 12. N represents integers from zero through N. A circuit such as the one illustrated in FIG. 1a exists for each set of address bits comprising an address bit and its complement. Each FIG. 1a circuit produces address factors $R_N$ from the input of address bits $A_N$ and $A_{N-}$. In connection with using a redundant memory cell in place of a usual memory cell, fuse 14 is blown when address bit $A_N$ is at a logic high level. Consequently, a high level signal is input to the gate of transistor 8 and inverter 10, thus resulting in a turned on transistor 8 and a turned off transistor 12. Note that feed back through transistor 6 helps maintain this logic high level signal. Alternatively, if address bit $A_N$ is at a logic low level, fuse 14 is not blown. This results in a turned off transistor 8 and a turned on transistor 12.

FIG. 1b is a schematic drawing of the circuit which processes the address factors from a plurality of circuits of the type shown in FIG. 1a. Each address factor is input into the gate of a plurality of transistors each labeled 16. When an address match occurs such that memory is addressed needing replacement by redundant memory, the gates of transistors 16 connected to NAND gate 18 are each at a logic low level resulting in inputting a high logic level signal into NAND gate 18. Consequently, during a logic high enable signal to NAND gate 18, NAND gate 18 outputs a low level logic signal to inverter 20. Inverter 20 outputs a high logic level signal which enables the redundant memory cell word line for the current address. Note that the redundancy system implemented by FIG. 1b results in only replacing one memory cell word line at a time. Unfortunately, such single replacement system is inadequate given today's need for memory speed.

FIG. 1c illustrates a schematic drawing of a prior art redundancy scheme which allows multiple replacement of the usual memory cell word lines by redundant memory cell word lines. The circuit in FIG. 1c is similar to the circuit of FIG. 1b. Note that the most important difference lies in the fact that no address factor $R_0$ (an address factor produced by address bits $A_0$ and $A_{0-}$) is used for input into a transistor 16. Consequently, this circuit results in replacing the use of two memory cell word lines with two redundant memory cell word lines during an address match since the least significant bit in an address makes no contribution by the way of address factors. During an address match with a logic high enable signal to NAND gate 18, NAND gate 18 outputs a logic low signal to inverter 20. NAND gate 18 and inverter 20 together implement an AND gate. Inverter 20 in turn outputs a high logic level signal. Depending on whether $A_0$ or $A_{0-}$ is at a high logic level the output of inverter 22 or 24, each connected to the output of inverter 20, will transmit a low logic level to the input of inverters 26 or 28. This will result in either a high logic level signal on redundant word line RWL0 or RWL1. A high logic level signal on a redundant word line allows the use of redundant memory cells with gates connected to this word line. Note that the foregoing described multiple replacement system does not always allow multiple replacement of certain defective word lines such as is produced by certain word line to word line shorts. FIG. 2 is a diagram which illustrates this problem. Since address factor $R_0$ is not used in the multiple replace scheme, addresses $A_0$ and $A_1$ can attain any state, logic zero or logic one, during an address match. Consequently, the regular word lines are replaced by the redundant memory lines two at a time during an address match such that all address bits past the last address bit are the same as the address one desires to match. Therefore, if A, B, C, and D represent word line to word line shorts between to adjacent word lines, it is easily seen that although shorts A and C can be corrected by the foregoing described multiple replacement scheme, shorts B and D cannot be replaced by the multiple replacement scheme. This problem is further illustrated by the chart below.

| A2 | A1 | A0 |
|---|---|---|
| 0 | 0 | 0 |
| 0 | 0 | 1 |
| 0 | 1 | 0 |

-continued

| A2 | A1 | A0 |
|---|---|---|
| 0 | 1 | 1 |

For a given address that requires a row address match for redundant memory use, addresses 000 and 001 are indistinguishable to the scheme. Such is also the case with addresses 010 and 011. Addresses 001 and 010 have different $A_1$ bits. Therefore, it is impossible to simultaneously replace word lines corresponding to word line addresses 001 and 010 since no address bit match can occur at address bit $A_1$. The prior art multiple replacement scheme solved this simultaneous replacement problem by blowing fuses so as to disregard not only address bit $A_0$ but also address bit $A_1$. This results in replacement of 4 word lines at a time rather than two word lines at a time. Extending this scheme further, in cases where address bit $A_2$ presented a problem, the scheme replaced 8 word lines at a time. Unfortunately, as is apparent, such a solution does not always best allocate redundant word line resources. The following scheme presents a more efficient solution to the foregoing multiple replacement problem.

Figure 1A:
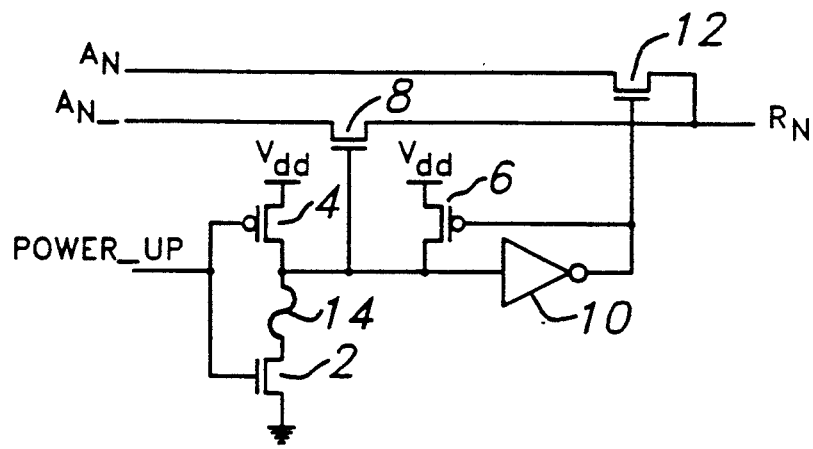
FIGS. 1a through 1c illustrate schematic drawings of prior art redundancy schemes.

Applicable reference numbers and letters are carried forward from figure to figure.

DETAILED DESCRIPTION OF THE INVENTION

The invention's DRAM redundancy circuit provides a considerable advantage in selecting redundant word lines to replace the regular word lines. This circuit makes use of some function logical function of the non-matching address bits of two word lines between which a word line to word line short exists. For example, the logical function can comprise the exclusive OR, or some function of the exclusive OR (i.e. exclusive NOR) of the non-matching address bits of two word lines between which a word line to word line short exists.

The chart below illustrates the necessary exclusive OR of address bits in an address in which certain address factors $R_N$ are ignored in decoding the redundant word line. For instance, where $R_0$ is ignored, $A_0$ and $A_1$ are exclusively ORed together to produce an input into a decoding circuit for correcting word line to word line shorts of the type indicated at B and D of FIG. 2. Where $R_0$ and $R_1$ are ignored, $A_1$ and $A_2$ are exclusively ORed together to produce an input into a decoding circuit for correcting word line to word line shorts wherein replacement occurring only four at a time with redundant word lines is not possible with the prior art scheme of the type previously discussed. For instance, the prior art scheme can not correct a word line to word line short for addresses 0011 and 0100 such that only four usual word lines are replaced with four redundant word lines. (Note that if address factors $R_0$ and $R_1$ are not used in a decoding scheme then multiple replacement of four usual word lines with four redundant word lines occurs.) The prior art scheme would require replacement of 8 word lines at a time to correct this type of defect since an address bit match is not possible at address bit $A_2$. Where $R_0$, $R_1$ and $R_2$ are ignored, $A_2$ and $A_3$ are exclusively ORed together to produce an input into a decoding circuit for correcting word line to word line shorts wherein replacement occurring only eight at a time with redundant word lines is not possible with the prior art scheme of the type previously discussed. For instance, the prior art scheme can not correct a word line to word line short for addresses 0111 and 1000 such that only eight usual word lines are replaced with eight redundant word lines. (Note that if address factors $R_0$, $R_1$, and $R_2$ are not used in a decoding scheme then multiple replacement of eight usual word lines with eight redundant word lines occurs.) The prior art scheme would require replacement of sixteen word lines at a time to correct this type of defect since it is not possible to match address bit $A_3$. The foregoing scheme is easily extended to a greater number of bits.

| A3 | 0 | 0 | 0 | 0 | 0 | 0 | 0 | 0 | 1 | 1 | 1 | 1 | 1 | 1 | 1 | 1 | 0 |
|---|---|---|---|---|---|---|---|---|---|---|---|---|---|---|---|---|---|
| A2 | 0 | 0 | 0 | 0 | 1 | 1 | 1 | 1 | 0 | 0 | 0 | 0 | 1 | 1 | 1 | 1 | 0 |
| A1 | 0 | 0 | 1 | 1 | 0 | 0 | 1 | 1 | 0 | 0 | 1 | 1 | 0 | 0 | 1 | 1 | 0 |
| A0 | 0 | 1 | 0 | 1 | 0 | 1 | 0 | 1 | 0 | 1 | 0 | 1 | 0 | 1 | 0 | 1 | 0 |
| EXOR A0 & A1 | 0 | 1 | 1 | 0 | 0 | 1 | 1 | 0 | 0 | 1 | 1 | 0 | 0 | 1 | 1 | 0 | 0 |
| EXOR A1 & A2 | 0 | 0 | 1 | 1 | 1 | 1 | 0 | 0 | 0 | 0 | 1 | 1 | 1 | 1 | 0 | 0 | 0 |
| EXOR A2 & A3 | 0 | 0 | 0 | 0 | 1 | 1 | 1 | 1 | 1 | 1 | 1 | 1 | 0 | 0 | 0 | 0 | 0 |

Figure 1C:
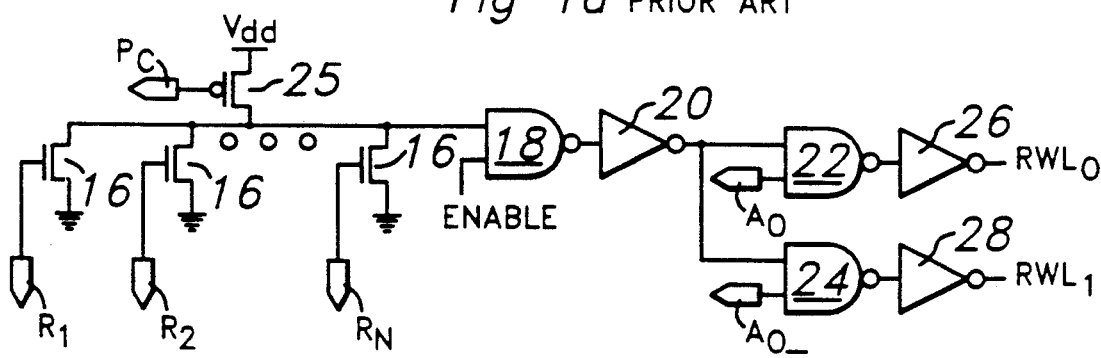
Figure 1B:
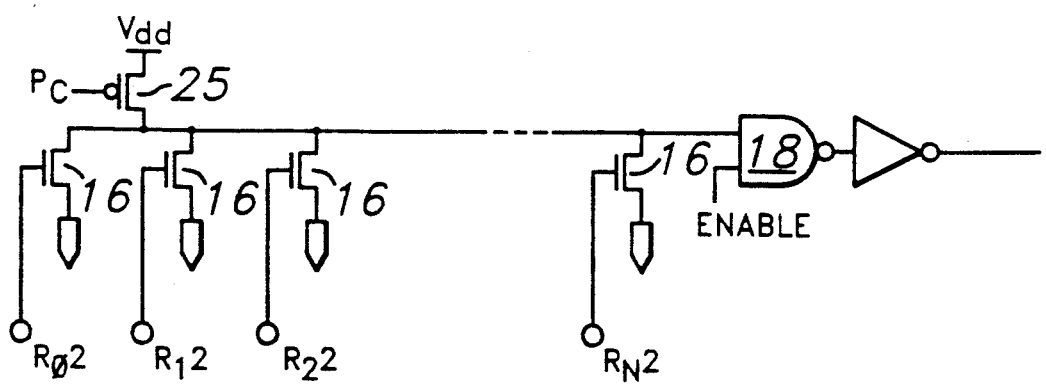
Figure 3:
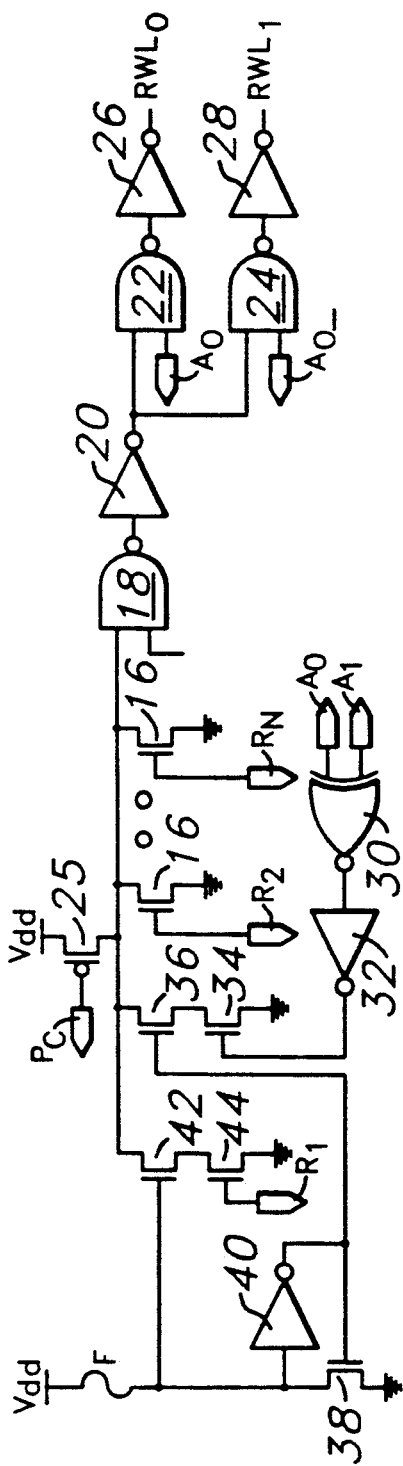
FIG. 3 illustrates a schematic drawing of a circuit illustrating an application of the invention's redundancy scheme.

FIG. 3 illustrates a schematic drawing of the preferred embodiment of a circuit for implementing the invention's multiple replacement scheme as applied to the case where address factor $R_0$ is ignored. This circuit comprises some of the elements shown in FIG. 1c. Address bits $A_0$ and $A_1$ are exclusively NORed together by exclusive NOR gate 30. This logic is converted to an exclusive OR by processing the output of gate 30 through inverter 32. Inverter 32's output is connected to the gate of n-channel transistor 34. Transistor 34 is coupled to an input of NAND gate 18 by n-channel transistor 36. N-channel transistor 36 has its gate connected to the gate of n-channel transistor 38 and the output of inverter 40. N-channel transistor 42 is connected by its gate to fuse F and the input of inverter 40 and the drain of transistor 38. The gate of transistor 44 receives the signal from address factor $R_1$.

Figure 2:
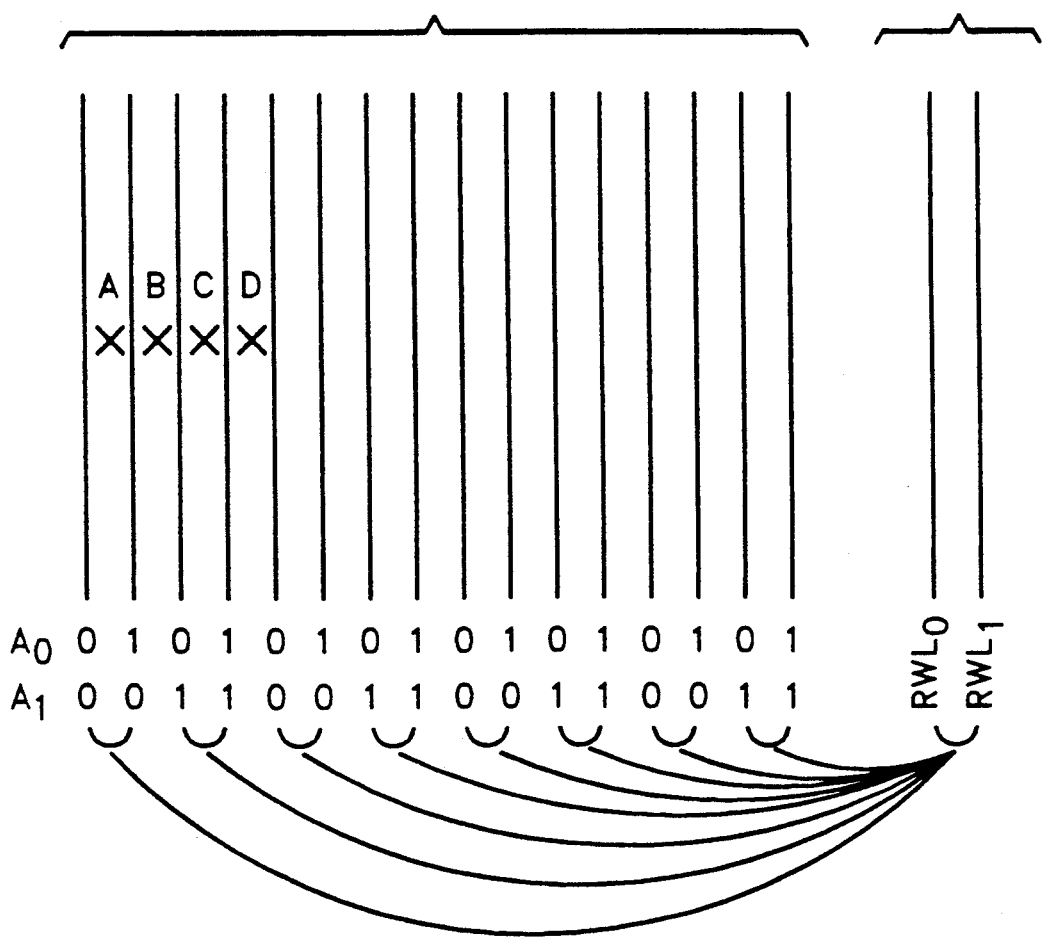
FIG. 2 illustrates a diagram of the defect replacement pattern for a prior art redundancy scheme.
Figure 4:
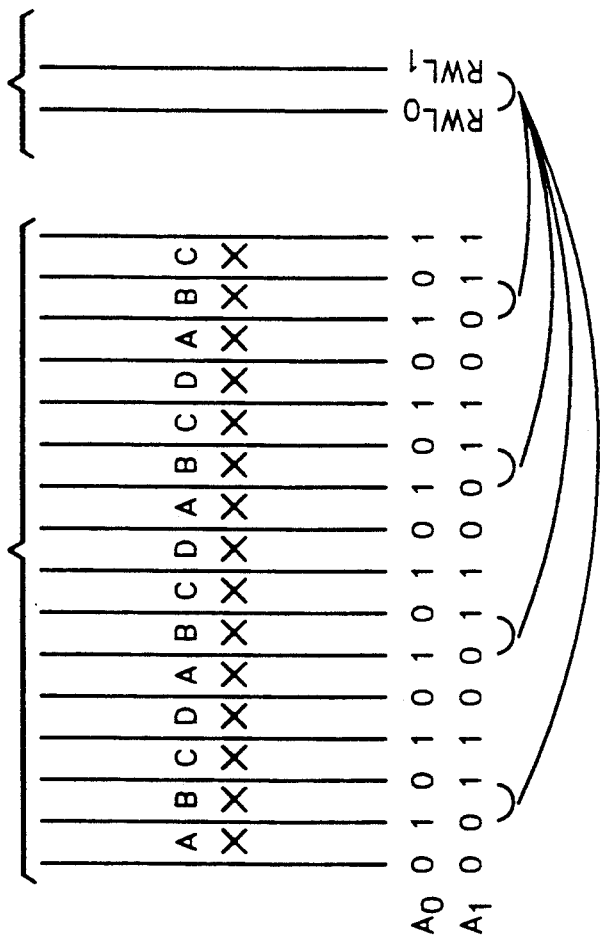
FIG. 4 illustrates a diagram showing a portion the invention's redundancy replacement capability as applied to the circuit FIG. 3.

The operation of the circuit of FIG. 3 shall be explained with reference to FIG. 3 and FIG. 4 which is a diagram similar to that shown in FIG. 2 except that defect B is now correctable without having to resort to the use of a greater number of redundant word lines than the two shown.

For the case where an address match occurs (indicating the need for redundancy replacement) and a type A or type C word line to word line short exists, fuse F is left intact. All of the address factors, $R_1$ through $R_N$, are represented as low logic level signals to the gates of the transistors which receive the address factor signals. Since inverter 40 is connected to supply voltage Vdd through fuse F, inverter 40 outputs a logic low level signal to the gate of transistors 36 and 38. This results in turned off transistors 36 and 38. Therefore, the exclusive OR logic performed on address bits $A_0$ and $A_1$ are isolated from input to NAND gate 18. Transistor 42 receives a high logic level signal at its gate to allow coupling of transistor 44 to NAND gate 18. Type A and type C defects are thus corrected by enabling redundant word lines RWL0 and RWL1.

For the case where an address match occurs and a type B and D defect exists, fuse F is blown. Address factors $R_2$ through $R_N$ are represented by a logic low signal to the gates of transistors 16. Transistor 42 is shut off due to its disconnection from supply voltage Vdd through fuse F and due to the pull down of voltage from turned on transistor 38 which receives a logic high level signal from inverter 40. Address factor $R_1$ now no longer contributes to the decoding of redundant word lines. Transistor 36 is additionally turned on by inverter 40 and the exclusive OR logic circuitry of gate 30 and inverter 32 is coupled to NAND gate 18 through transistor 36. Note, however, that in the case of an address match, inverter 32 outputs a logic low level signal to the gate of transistor 34. Thus the NAND gate 18 input connection remains at a logic high level, thereby allowing redundant word line selection in connection with a logic high enable signal to NAND gate 18.

For the case where no defect is noted, fuse F remains intact and at least one of address factors $R_1$ through $R_N$ is at a logic high level, thereby pulling the input of NAND gate 18 down to a logic low level. This prevents activation of the redundant word lines.

Although the invention has been described in detail herein with reference to its preferred embodiment, it is to understood that this description is by way of example only and is not to be construed in a limiting sense. It is to be further understood that numerous changes in the details of the embodiments of the invention, and additional embodiments of the invention, will be apparent to, and may be made by persons of ordinary skill in the art having reference to this description. For instance, this scheme can be applied memory columns so as to provide for instance, bit line redundancy to correct defects on bit lines. Further, although the foregoing invention has been described with regard to a DRAM, it may be used as a redundancy scheme for any memory including read only memories and static random access memories. Note that in the circuits shown implementing the invention's scheme that p-channel transistors, n-channel transistors, and bipolar transistors (n-type or p-type) can be substituted for each other throughout. The fuses disclosed may comprise laser blown fuses as well as electrically blown fuses. It is contemplated that all such changes and additional embodiments are within the true scope and spirit of the invention as claimed below.

I claim:

1. A memory redundancy scheme comprising;
   a logic gate;
   a logic function circuit;
   a plurality o transistors coupled to an input of said logic gate, a controlling terminal of at least one transistor of said plurality of transistors being operable to receive a signal generated from the output of said logic function circuit, said logic function circuit being operable to receive a predetermined number of address bits from the memory current address, the remaining controlling terminals of said plurality of transistors being operable to receive an associated address factor, each said address factor being generated from processing of a corresponding address bit of both said address for which a defect exists and the memory current address.

2. A memory redundancy scheme as recited in claim 1 wherein said logic function circuit is operable to perform logic which selected from the group consisting of exclusive OR, exclusive NOR, or a combination thereof.

3. An electronic device including the memory redundancy scheme recited in claim 1.

4. An electronic device as recited in claim 3 which is selected from the group consisting of memories, calculators, personal computers, microcomputers, and micro computers.

5. An electronic system including the memory redundancy scheme recited in claim 1.

6. An electronic system as recited in claim 5 which comprises a television system selected from the group consisting of enhanced definition television and high definition television.

7. A method for decoding an address in a memory in order to select a redundant word line comprising:
   determining an address for which a defect exists;
   generating a plurality of address factors, each address factor being determined from a corresponding address bit of said address for which a defect exists and the memory current address, in connection with the matching of an address bit of said address for which a defect exists and the corresponding address bit of the memory current address;
   generating a signal which is a logical function of corresponding but non matching address bits of at least two addresses for which defects exist, said address bits of said at least two addresses being selected from the group consisting of the least significant address bit through the most significant address bit; and
   determining redundant word line selection form predetermined logic states of said plurality of address factors and said signal which is a logic function of corresponding bu nonmatching address bits.

* * * * *